United States Patent [19]
Groover

[11] Patent Number: 5,949,156
[45] Date of Patent: Sep. 7, 1999

[54] PRECISION CAPACITOR LADDER USING DIFFERENTIAL EQUAL-PERIMETER PAIRS

[75] Inventor: Robert Groover, Dallas, Tex.

[73] Assignee: STMicroelectronics, Inc., Carrollton, Tex.

[21] Appl. No.: 08/895,148

[22] Filed: Jul. 16, 1997

Related U.S. Application Data

[63] Continuation-in-part of application No. 08/488,098, Jun. 7, 1995, abandoned.

[51] Int. Cl.$^6$ .................................................. H02M 3/06
[52] U.S. Cl. ........................................ 307/109; 341/118
[58] Field of Search .............................. 307/109; 706/34; 361/328–330, 541, 522, 830; 257/532, 534, 535, 919, 925; 341/118, 120, 150

[56] References Cited

U.S. PATENT DOCUMENTS

| | | | |
|---|---|---|---|
| 5,189,595 | 2/1993 | Dunkley | 257/532 |
| 5,579,005 | 11/1996 | Moroni | 341/118 |

OTHER PUBLICATIONS

Said, "Novel drift–free fully differential switched capacitor filter based on the simulation of ladder structures" 66 International J. Electronics 801 (1989).
Tan et al., "A 5 V, 16 b 10 mu s differential CMOS ADC" 1990 ISSCC Digest 166.
Tan et al., "Error correction techniques for high–performance differential A/D converters" 25 IEEE J. Solid–State Circuits 1318 (1990).
Hester et al., "Fully differential ADC with rail–to–rail common–mode range and nonlinear capacitor compensation" 25 IEEE J. Solid–State Circuits 173 (Feb. 1990).
Ramet, "A 13–bit, 160 kHz, differential analog to digital converter" 1989 ISSCC Digest 20.
Lee, "A 12–b 600 ks/s Digitally Self–Calibrated Pipelined Algorithmic ADC," *IEEE J. Solid–State Circuits* 29(4):509–515, 1994.
Ginetti et al., "A CMOS 13–b Cyclic RSD A/D Converter," *IEEE J. Solid–State Circuits* 27(7):957–965, 1992.
Yamada et al., "A Switched–Capacitor Interface for Capacitive Pressure Sensors," *IEEE Transactions on Instrumentation and Measurement* 4(1):81–86, 1992.
Esashi and Matsumoto, "Common Two Lead Wires Sensing System," *Transducers* '91:330–333, 1991.
Schöneberg et al., "CMOS Integrated Capacitivie Pressure Transducer With On–Chip Electronics and Digital Calibration Capability," *Transducers* '91:304–307, 1991.
Adams et al., "theory and Practical Implementation of a Fifth–Order Sigma–Delta A/D Converter," *J. Audio Eng. Soc.*, 39(7/8):515–528, 1991.
Morris and Hague, "Application–oriented data converters for a CMOS cell library," *J. Semicustom ICs* 7(4):26–31, 1990.
Rebeschini et al., "A 16–b 160–kHz CMOS A/D Converter Using Sigma–Delta Modulation," *IEEE J. Solid–State Circuits* 25(2):431–440, 1990.
Ueno et al., "A High–Accuracy Switched–Capacitor Pipelined Analog–to–Digital Converter," *Transactions of the IEICE* E72(12):1285–1291, 1989.

(List continued on next page.)

*Primary Examiner*—Richard T. Elms
*Attorney, Agent, or Firm*—David V. Carlson; Therodore E. Galanthay

[57] ABSTRACT

An integrated circuit capacitor ladder which uses a differential pair of capacitors for each step in the ladder. By pairing a square with a rectangle of equal perimeter, the contributions of edge and corner elements can be canceled out. This adds area and complexity, but greatly increases the precision of scaling.

19 Claims, 6 Drawing Sheets

OTHER PUBLICATIONS

Yung and Chao, "An Error–Compensation A/D Conversion Technique," *IEEE International Symposium on Circuits and Systems*(1):258–261, 1989.

Doernberg et al., "A 10–bit 5–Msample/s CMOS Two–Step Flash ADC," *IEEE J. Solid–State Circuits*24(2):241–249, 1989.

Song et al., "A 12–bit 1–Msample/s Capacitor Error–Averaging Pipelined A/D Converter," *IEEE J. Solid–State Circuits* 23(6):1324–1333, 1988.

Doernberg and Hodges, "A 10–bit Msample/sec CMOS 2–Step Flash ADC," *IEEE Custom Integrated Circuits Conference*: 18.6.1–18.6.4, 1988.

Park and Wise, "An MOS Switched–Capacitor Readout Amplifier for Capacitive Pressure Sensors," *IEEE Custom Integrated Circuits Conference*:380–384, 1983.

Hester et al., "A Monolithic Data Acquisition Channel," *IEEE Transactions on Acoustics, Speech, and Signal Processing ASSP*–31(1):305–313, 1983.

PRECISION CAPACITOR LADDER USING DIFFERENTIAL EQUAL-PERIMETER PAIRS

This application is a continuation-in-part of U.S. application Ser. No. 08/488,098, filed Jun. 7, 1995, which is now abandoned.

TECHNICAL FIELD

The present invention relates generally to analog integrated circuits containing capacitor arrays, and, more specifically, to precision capacitor arrays which implement digitally selectable capacitance values.

BACKGROUND OF THE INVENTION

A well-known problem with integrated circuit capacitors is that their capacitance does not scale directly with drawn area. The capacitance at the edge will be affected by linewidth variations, and also by fringing field effects. This is not a problem for very small arrays, but becomes more of a problem as the number of capacitors in the array increases. Thus if we try to build a chain of 8 capacitors scaled by powers of two, we may find that the transition from 01111111 to 1000000 is in the wrong direction, or is excessively large.

MOS capacitors provide a fairly high raw capacitance per unit area, but the capacitance of MOS capacitors is affected by a number of process parameters, e.g., gate oxide thickness, substrate doping, well doping if used, VT doping if used, linewidth variation (in polysilicon and in active), and variations in the degree of birds beak encroachment on the active area, (and hence variation in the capacitance of a capacitor whose area is determined by an active area pattern). Moreover, variations in field oxidation conditions and/or channel stop implant may produce some variation in the doping underlying the birds beak extension, and this too will have some effect on the capacitance contribution at the perimeter of a MOS capacitor.

This is particularly a problem in converters (ADCs and DACs), where capacitor ladders are very commonly used. However, similar problems may arise in many other analog circuit contexts. Accurate capacitor ladders provide digitally selectable reactances which can be useful for various telecommunications, radio frequency, and switched-capacitor circuits.

Many attempts have been made to compensate for this problem. For example, U.S. Pat. No. 5,579,005, which is hereby incorporated by reference, describes an innovative way to correct for capacitor nonlinearity; but the present application proposes a hardware technique to effectively eliminate it.

There is a need for an integrated circuit capacitor array structure that provides accurate capacitance values by compensating for edge effects and variations in the areas of individual capacitors in the array.

SUMMARY OF THE INVENTION

The present application discloses a circuit architecture which uses a differential pair of capacitors for each step in the ladder. By pairing a square capacitor with a rectangular capacitor of equal perimeter, the contributions of edge and corner elements can be canceled out. This adds area and complexity, but greatly increases the precision of scaling. Of course, the absolute capacitance per unit area is still dependent on process variables, but the present invention lets designers specify capacitance ratios with greatly increased precision. The idea is that the long thin capacitor should have exactly the same variation in capacitance contributions due to straight-line perimeter length, and almost exactly the same variation in corner-dependent capacitances, so we are left with a net capacitance due solely to the homogeneous central area of the more square capacitor. These central elements are determined directly by the drawn geometry, and hence can be more accurately designed into desired proportions.

This is done, for example in one embodiment, by using paired MOS capacitors for each step in the array. For the even-numbered steps, one of these capacitors will be drawn as a square, and the other will be an elongated minimum-width rectangle of equal perimeter or of some other shape. The area differences between the square capacitor and the thin capacitor will then be stepped to provide the scale of powers of two. For the odd-numbered steps, the next lower differential pair can be replicated, or alternatively non-integer size values can be used.

It is believed that the use of differently shaped capacitors to analyze the various components of capacitance is known in test structures, but the disclosed inventions use a circuit combination of different shapes in a way which cancels some of the most variable contributions to capacitance.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
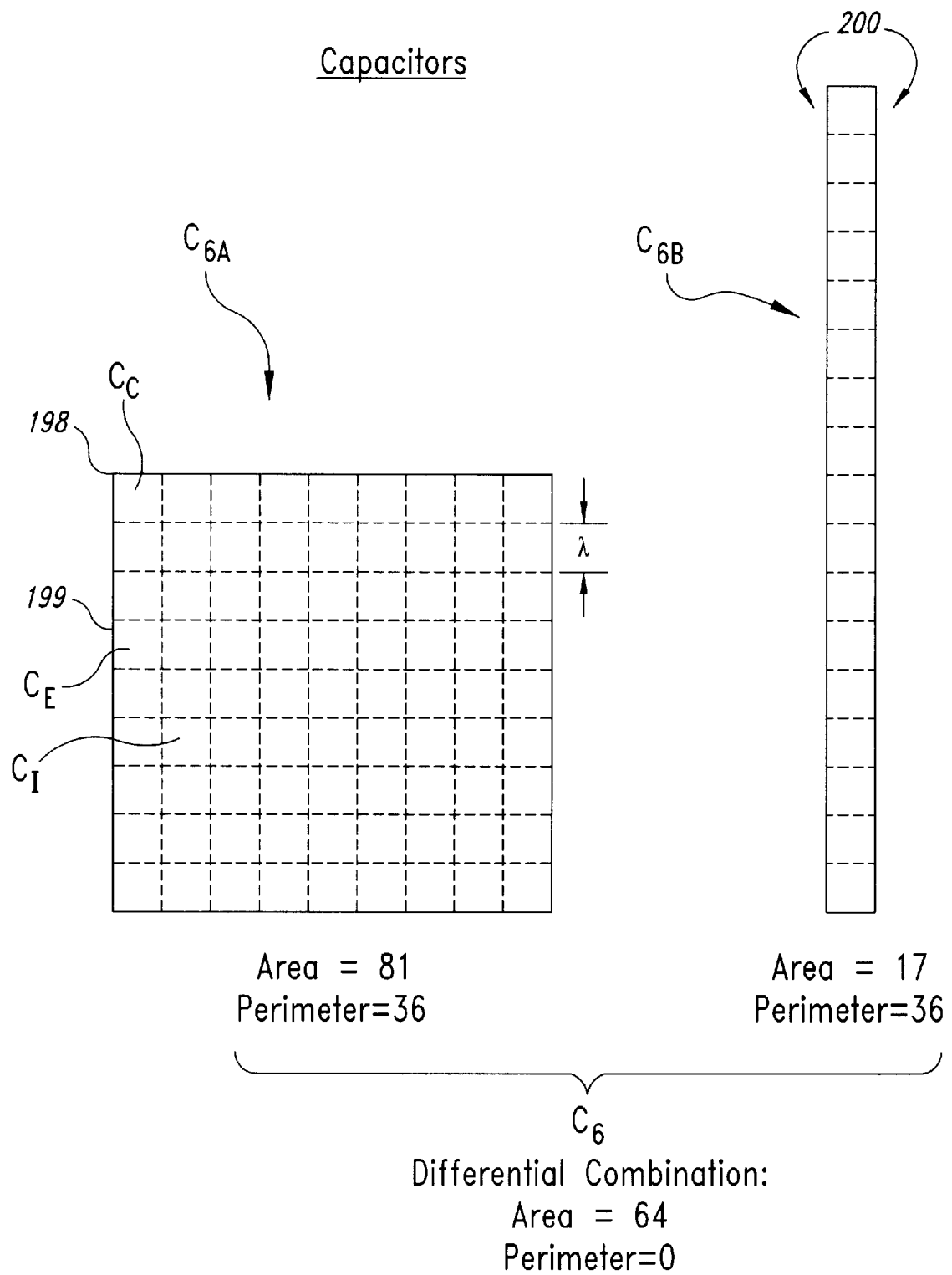
FIG. 1 shows drawn outlines of a differential pair of capacitors.

The numerous innovative teachings of the present application will be described with particular reference to the presently preferred embodiment (by way of example, and not of limitation), in which:

FIG. 1 shows drawn outlines of one such differential pair $C_6$ of capacitors $C_{6A}$ and $C_{6B}$. The left element $C_{6A}$ has an area of $81\lambda^2$ (where $\lambda$ is the minimum geometry) and a perimeter of $36\lambda$. The right element $C_{6B}$ has an area of $17\lambda^2$ and a perimeter of $36\lambda$. The resulting differential combination $C_6$ then has a net effective area of $64\lambda^2$ and a perimeter of $0\lambda$.

The most area-conservative way to use this invention is to use a square for one capacitor $C_{nA}$ of a differential pair, and to use a minimum-width linear capacitor $C_{nB}$ for the other element of the differential pair. A square which is n+1 units on a side will have an area of $n^2+2n+1$ and a perimeter of 4n+4. The same perimeter can be achieved by a narrower capacitor $C_{nB}$ which is one unit wide and (2n+1) units long, and therefore has a drawn area of 2n+1 and a perimeter of 4n+4. Thus, the difference between the two will produce an equivalent capacitor $C_6$ which has a net effective area of $n^2$, and a net effective perimeter contribution of 0.

This numerical relation works for all even powers of two; for odd powers of two a nonintegral value can be used for the larger dimensions (IF the design software and mask fabrication permit this), or (more simply) two differential capacitors can be paralleled. For example, in FIG. 3 two instances of capacitor $C_{6A}$ on the left side of FIG. 1 can be connected in parallel to provide a capacitor $C_{7A}$, and two examples of capacitor $C_{6B}$ on the right side of FIG. 1 can be connected in parallel to provide a capacitor $C_{7B}$, and capacitors $C_{7A}$ and $C_{7B}$ can then be connected differentially through, for example, a differential circuit 110 to provide a capacitor $C_7$ with an effective area of $128\lambda^2$.

The technique of paralleling differential pairs also provides some layout flexibility to avoid the use of very large linear elements. Moreover, by alternating the A and B capacitors in a 2×2 grid such as

| $C_{nA}$ | $C_{nB}$ |
|---|---|
| $C_{nB}$ | $C_{nA}$ | parameter variation within the wafer can be even more accurately compensated. (This is a conventional design technique.)

Figure 2:
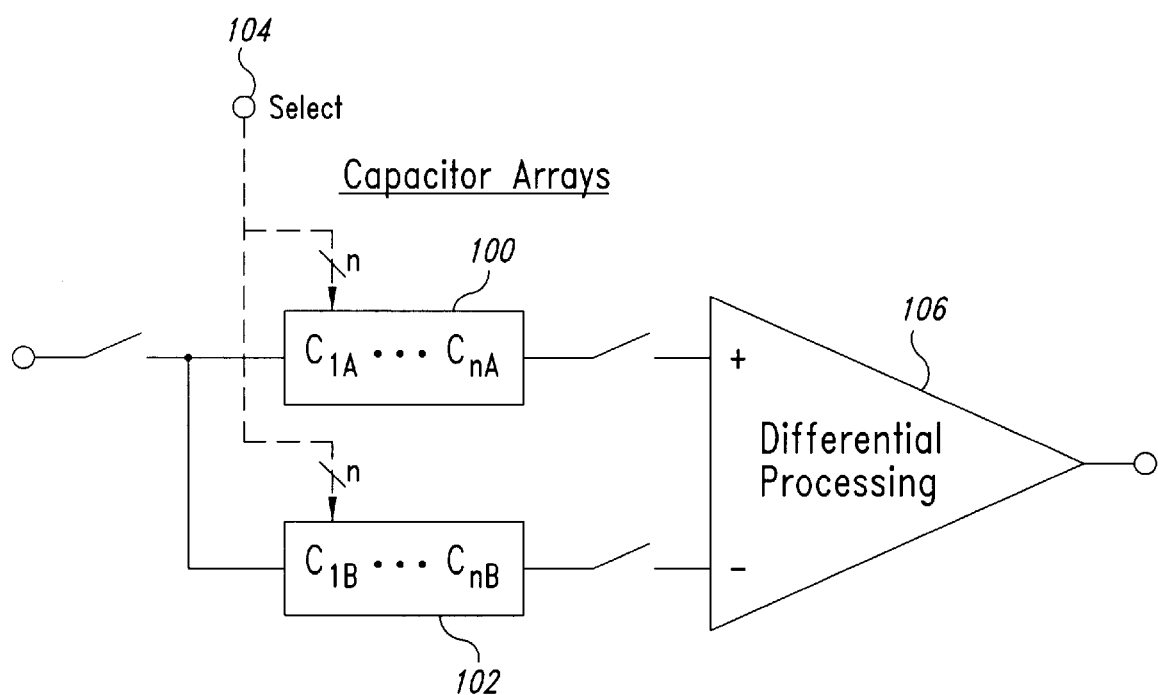
FIG. 2 is a block diagram of a differential capacitor array circuit according to one embodiment of the present invention.
Figure 3:
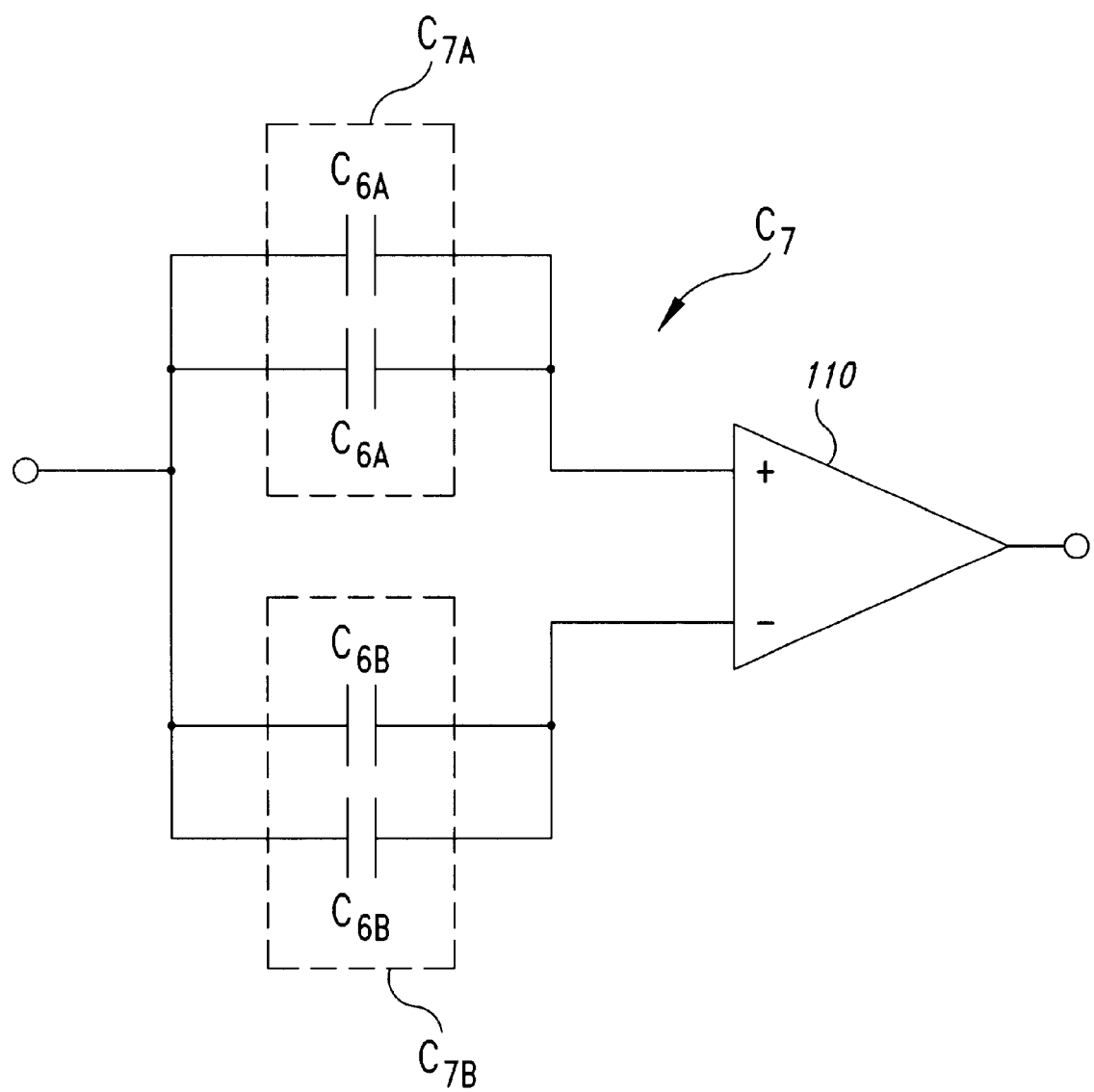
FIG. 3 is a schematic block diagram of a circuit for providing a desired capacitance value according to one embodiment of the present invention.

FIG. 3 is only the simplest example of a larger class of embodiments. For the larger capacitor values, the individual capacitors of the differential pair will preferable not be implemented as a single plate. Instead, each capacitor of the differential pair can be implemented as a plurality of paralleled capacitors, with the paralleled capacitors having the same relationship of equal perimeter and different area. Various circuit techniques can be used to subtract the small capacitors from the large capacitors; in fact, some of these are already used in trimmed A–D arrays. FIG. 2 very schematically shows such a differential connection. The A and B capacitor arrays 100 and 102, respectively, receive the same digital selection signal 104, so each selected A capacitor in the array 100 is matched by a selected B capacitor in the array 102. The differential processing stage is shown very schematically as a differential amplifier 106, but in practice a variety of circuit techniques can be used to perform the needed subtraction in voltage, current, or charge domains. For example, charge subtraction in the larger capacitor array of the arrays 100 and 102 can itself be used to produce the net difference.

Each bit of the selection signal 104 selects one of the capacitor pairs $C_{ka}/C_{kb}$. Thus, the n-bit signal can select any capacitance value from zero to the summation from k=1 to n of the differences ($C_{KA}-C_{KB}$). In one embodiment, the signal 104 has the same number of bits as there are capacitors in each array. Each bit in the selection signal will select the pair of capacitors to which it corresponds. For example, if there are six capacitors in the array, signal 104 will be a 6 bit signal; if only the first bit is high, capacitors $C_{1A}$ and $C_{1B}$ are selected. If the first and third bits are high, capacitors $C_{1A}$ and $C_{3A}$ are both selected as are their corresponding capacitors $C_{1B}$ and $C_{3B}$. If all bits are high, then all capacitors from each array are selected. This type of selection signal does not require decoding and permits one or more sets of capacitors to be easily connected to achieve a desired difference capacitive value.

Of course it is slightly more inconvenient to use a differential connection for a capacitor ladder, but such connections are already commonly used for correction arrays. (An important technique in converters is the use of error arrays or correction arrays. In the classical form the main array of capacitors is paralleled by a second array which stores offset values. Ideally the circuit can run a self-calibration procedure (e.g., when powered up), and store corresponding offset voltages in the error array. These techniques are described in the various Tan et al. and Hester et al. articles cited below.) As discussed in these articles, such circuits use a correction array of capacitors which are used to store charge values indicating offsets. Thus, such arrays provide in effect a calibration adjustment, indicated by a charge value, for each of the capacitors in the primary capacitor ladder. This is a significantly different idea from the present invention, which simply provides a more accurate scaling of the capacitor values themselves. Of course, in alternative embodiments, error correcting or self-calibration networks can be used in combination with differential capacitor structures under the present invention.

Many other differential connection circuits have been presented in the literature; see, e.g., Lee, "A 12-b 600 ks/s digitally self-calibrated pipelined algorithmic ADC," 29 IEEE J. Solid-State Circuits 509 (1994); Ginetti et al., "A CMOS 13 bit cyclic RSD A/D converter," ESSCIRC '91 Proceedings 245; Yamada et al., "A switched-capacitor interface for capacitive pressure sensors," 41 IEEE Trans'ns Instrumentation and Measurement 81 (1992); Esashi et al., "Common two lead wires sensing system," TRANSDUCERS '91 330; Schoneberg et al., "CMOS integrated capacitive pressure transducer with on-chip electronics and digital calibration capability," TRANSDUCERS '91 304 (1991); Adams et al., "Theory and practical implementation of a fifth-order sigma-delta A/D converter," 39 J. The Audio Engineering Society 515 (1991); Tan et al., "A 5 V, 16 b 10 mu s differential CMOS ADC," 1990 ISSCC DIGEST 166; Tan et al., "Error correction techniques for high-performance differential A/D converters", 25 IEEE J. Solid-State Circuits 1318 (1990); Morris et al., "Application-oriented data converters for a CMOS cell library," 7 J. Semicustom ICs 26 (1990); Rebeschini et al., "A 16-b 160-kHz CMOS A/D converter using sigma-delta modulation," 25 IEEE J. Solid-State Circuits 431 (1990); Hester et al., "Fully differential ADC with rail-to-rail common-mode range and nonlinear capacitor compensation," 25 EEE J. Solid-State Circuits 173 (1990); Ueno et al., "A high-accuracy switched-capacitor pipelined analog-to-digital converter, E72 Transactions of the Institute of Electronics, Information and Communication Engineers E 1285 (1989); Yung et al., "An error-compensation A/D conversion technique," 1989 EEE International Symposium on Circuits and Systems 258; Ramet, "A 13-bit, 160 kHz, differential analog to digital converter," 1989 ISSCC Digest 20; Said, "Novel drift-free fully differential switched capacitor filter based on the simulation of ladder structures," 66 International J. Electronics 801 (1989); Doernberg et al., A 10-bit 5-Msample/s CMOS two-step flash ADC," 24 EEE J. Solid-State Circuits 241 (1989); Song et al., A 12-bit 1-Msample/s capacitor error-averaging pipelined A/D converter," 23 IEEE J. Solid-State Circuits 1324 (1988); Doernberg et al., "A 10-bit 5 Msample/sec CMOS 2-step flash ADC," 1988 Custom Integrated Circuits Conference paper 18.6; Park et al., "An MOS switched-capacitor readout amplifier for capacitive pressure sensors," IEEE 1983 Custom Integrated Circuits Conference 380 (1983); and Hester et al., "A monolithic data acquisition channel," 31 IEEE Trans'ns Acoustics, Speech and Signal Processing 305 (1983); all of which are hereby incorporated by reference.

In an alternative class of embodiments, the primary capacitors $C_{6A}$ may be given an aspect ratio other than perfectly square (especially for the larger capacitors) and/or the secondary capacitors $C_{6B}$ may be made more than one unit wide. The latter variation can be convenient for high precision, to allow best compensation for geometry-dependent field enhancement (since the capacitance of a 180 degree bend is not necessary equal to the sum of the capacitances of two 90 degree bends).

Note that the square+rectangle embodiment of FIG. 1 provides not only equal perimeters, but also an equal number of corners in the A and B capacitors. This provides compensation for any effects due to electric-field enhancement at the corners. (Geometry-dependent electric field enhancement is a familiar phenomenon, discussed in any elementary physics textbook, which causes the electric field of a charged body to be increased at corners of a charged body. The interaction of such geometric effects with the details of junction curvature and doping-profile-dependent CV relations is not trivial.)

In an alternative class of embodiments, it is contemplated that meandered lines can be used for the larger linear capacitors $C_{nB}$ to economize on layout space. In this embodiment the minimum radius of a meander is preferably at least 8 times the minimum layout geometry. Alternatively, more sharply meandered lines can be used, with appropriate compensation for the changed dependence of capacitance on boundary length for the concave sides of the curves.

The present invention is applicable to MOS capacitors, and also to poly-to-poly capacitors in which both plates of the capacitor are polysilicon. Such poly-to-poly capacitors are less susceptible to some sources of process variation, but still are susceptible to linewidth variation and (like any capacitor) to fringing field effects. The present invention compensates for both of these effects. The invention can also be applied to junction capacitors.

For maximum accuracy in a CMOS process, one plate of the capacitor is preferably defined in poly, and the poly is surrounded by active which receives neither P+ nor N+ source/drain implant. Use of well and VT doping can be selected to maximize specific capacitance within the limits of tolerable CV dependence (MOS capacitors inherently have some variation of capacitance with voltage).

Figure 6:
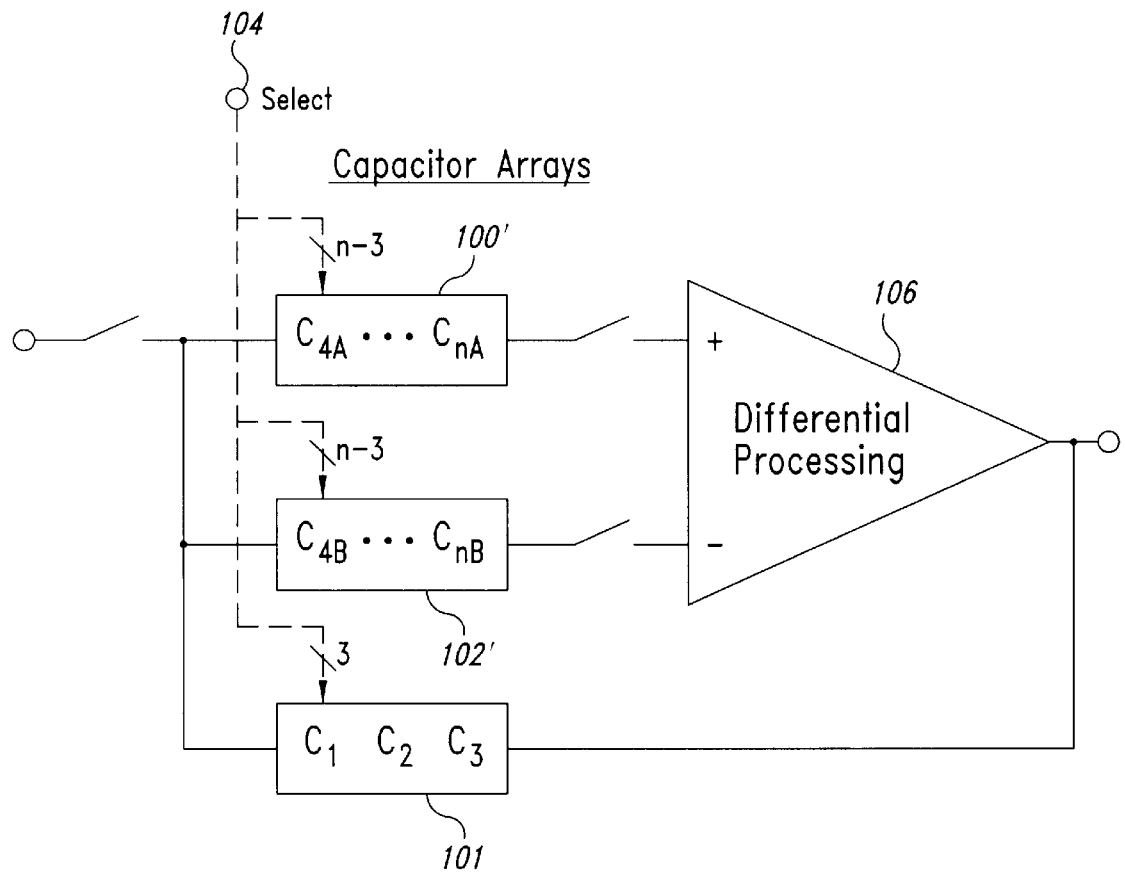
FIG. 6 is a schematic block diagram of a differential capacitor array circuit according to another embodiment of the present invention.

In an alternative class of embodiments, as shown in FIG. 6, the smallest bits do not have to use the differential capacitor pairs, since the LSBs are not the most critical contributor to total error (which is cumulative).

According to a disclosed class of innovative embodiments, there is provided: An integrated circuit capacitor array, comprising: first and second arrays of capacitors, connected to receive identical selection inputs and to selectively connect and disconnect capacitors accordingly; wherein individual capacitors of said first array each have a perimeter which is equal to that of a corresponding capacitor in said second array, and an area which differs from that of said corresponding capacitor by a desired proportional capacitance fraction.

FIG. 1 shows a differential pair of capacitors $C_{6A}$ and $C_{6B}$ divided into capacitive elements as indicated by the dotted lines at minimum geometry spacing $\lambda$. The capacitor $C_{6A}$ includes three kinds of minimum-geometry capacitive elements: (1) four corner capacitive elements designated $C_C$; (2) twenty-eight edge capacitive elements designated $C_E$ that lie on the edges but not at the corners; and (3) interior capacitive elements designated $C_I$. It should be noted that these capacitive elements $C_C$, $C_E$, and $C_I$ are not physically separate, but merely correspond to imaginary lines drawn across the capacitor's area. The interior capacitive elements $C_I$ each add a capacitance contribution which is directly proportional to their area. The edge capacitive elements $C_E$ each add this area-dependent contribution, and also add an additional contribution which is determined by the capacitive coupling into an edge-adjacent area 199. The corner capacitive elements $C_C$ each add an area-dependent contribution, an additional contribution which is determined by the capacitive coupling into edge-adjacent area 199, and also a further contribution determined by the capacitive coupling into corner-adjacent area 198. These capacitive coupling contributions of the edge and corner elements $C_E$ and $C_C$, respectively, may be collectively referred to as fringe capacitance. This fringe capacitance is not directly proportional to the area of the capacitor $C_{6A}$. However, the use of a differential combination of capacitors permits the fringe capacitance contributions of two capacitors to be canceled. Note that capacitor $C_{6B}$, unlike capacitor $C_{6A}$, includes capacitive coupling into an edge area 200 on every capacitive element.

In capacitor $C_{6A}$, the contributions of the corner and edge elements $C_C$ and $C_E$, respectively, will be affected not only by linewidth variations as discussed below, but also by changes in other factors which may affect the fringe capacitance. For example, the voltage present on the capacitor will affect the depletion or enhancement of semiconductor regions which lie next to these locations, and hence the junction capacitance of edge and corner elements will vary with applied voltage in a way which is not necessarily the same as the way the capacitance of the interior elements $C_I$ varies with applied voltage.

Figure 4:
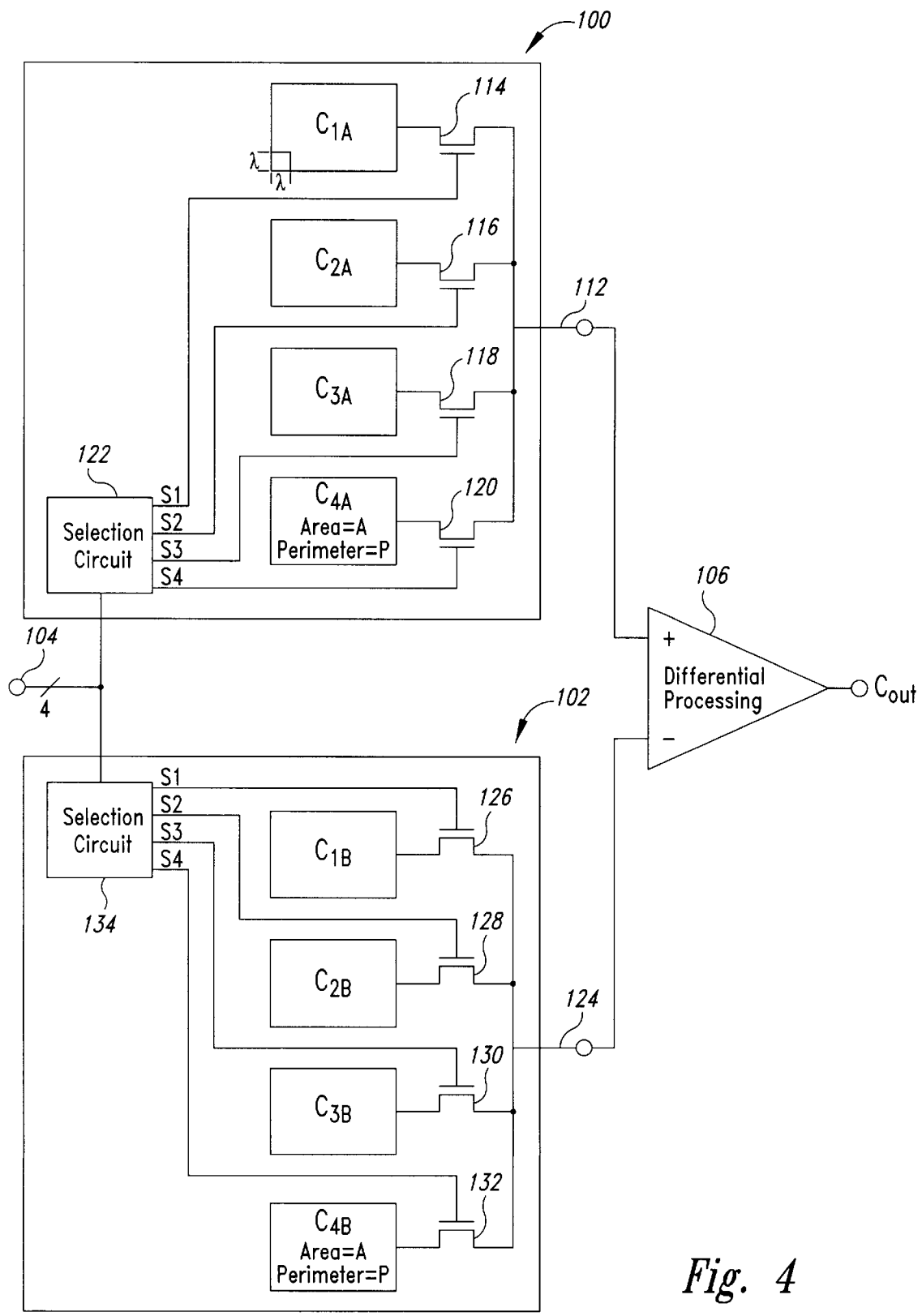
FIG. 4 is a more detailed block diagram of the capacitor array circuit of FIG. 2.

FIG. 4 is a more detailed block diagram of the capacitor arrays 100 and 102 according to one embodiment of the present invention. The capacitor arrays 100 and 102 are shown as including four capacitors $C_{1A}$–$C_{4A}$ and $C_{1B}$–$C_{4B}$, respectively, each capacitor having the indicated dimensions. Of course, each array can comprise as few as one capacitor or as many as dozens of capacitors, such as 6A and 6B as shown in FIG. 1. The size of the capacitors can be measured in units having a width and length of $\lambda$ as described with reference to FIG. 1, one of which is shown for the capacitor $C_{1A}$. The capacitors $C_{1A}$–$C_{4A}$ are coupled through access transistors 114–120, respectively, to an output terminal 112, and the capacitors $C_{1B}$–$C_{4B}$ are coupled through access transistors 126–132, respectively, to an output terminal 124. Each of the capacitor arrays 100 and 102 further includes a selection circuit 122 and 134, respectively, coupled to receive the selection signal 104. In response to the selection signal 104, each selection circuit 122 and 134 activates one of four selection outputs S1–S4. The selection outputs S1–S4 of the selection circuits 122 and 134 are coupled to the gate terminals of the access transistors 114–120 and 126–132, respectively. Each of the selection outputs S1–S4, when activated, turns ON the associated access transistor such that the selected capacitor in each array 100 and 102 is coupled to the corresponding output terminal 112 and 124, respectively. The output terminals 112 and 124 are coupled to respective input terminals of the differential processing circuit 106, which operates to provide on its output terminal a capacitance $C_{OUT}$ having a value that is equal to the difference between the values of the capacitors coupled to the output terminals 112 and 124.

Each of the capacitors $C_{1A}$–$C_{4A}$ in the array 100 has a corresponding capacitor $C_{1B}$–$C_{4B}$, respectively, in the capacitor array 102 to which it is matched. Each capacitor in a matched pair of capacitors has an equal perimeter and a different area. The capacitors $C_{4A}$ and $C_{4B}$ illustrate that any dimensions of matched pairs of capacitors can be selected as desired so long as the perimeters P of the two capacitors are equal and the areas are unequal.

In the presently preferred embodiment, the capacitor arrays are scaled in powers of 2. This "capacitor ladder" structure permits full digital selection of the desired resulting capacitance. The disclosed architecture is particularly valuable in this context, since the improved linearity avoids anomalies at the transition from $2^n-1$ to 2n. However, the disclosed differential capacitance techniques can also be applied to other array architectures which are not fully scaled in powers of 2. This may be advantageous, for example, where precision capacitance ratios, with some degree of selectability, are required for other purposes. For example, in some embodiments, the capacitors in the array could have areas in the range of 500 $\lambda^2$, 5,000 $\lambda^2$, 50,000 $\lambda^2$ or larger to obtain precision capacitance measurement of a large size.

In operation, an external circuit (not shown) generates the selection signal 104 corresponding to the selected matched pair of capacitors in the capacitor arrays 100 and 102. Since there are four capacitors in each array, a 4 bit selection signal 104 is used and circuits 122 and 134 are pass through circuits. If the first bit is high, S1 is also high to select the first pair $C_{1A}$ and $C_{1B}$. Similarly, each bit being high will cause the corresponding selection signal S2, S3 or S4 to be high to select the corresponding capacitors. This permits any combination of capacitors to be selected. According to an alternative embodiment, the selection circuits 122 and 134 are decoder circuits instead of pass through circuits. In this embodiment, since only one of four is being selected a two bit signal is sufficient If there are up to eight pairs of capacitors, a three bit signal is required, and so forth.

In response to the selection signal 104, the selection circuits 122 and 134 receive the signal and activate the selected one or ones of their selection outputs S1–S4, thereby coupling the selected capacitors through the associated access transistors to the output terminals 112 and 124, respectively. Such pass through circuits or decoders that can operate as selection circuits 122 and 134 are well known in the art. Assume the selection signal 104 has a value of 1010 which is to select the capacitors $C_{1A}/C_{1B}$ and $C_{3A}/C_{3B}$. When the selection circuits 122 and 132 receive this selection signal 104, the selection circuits each activate their selection outputs S1 and S3, thereby activating the access transistors 114, 118, 126, and 130. When the access transistors 114, 118, 126 and 130 are activated, the capacitors $C_{1A}+C_{3A}$ and $C_{1B}+C_{3B}$ are coupled to the output terminals 112 and 124, respectively. The differential processing circuit 106 then outputs a signal at $C_{OUT}$ having a value equal to the difference between the values of the capacitors $C_{1A}+C_{3A}$ and $C_{1B}+C_{3B}$. In the same way, when any bit in the selection signal 104 is high, it selects the matched pair of capacitors corresponding to that bit or bits. This can be done for any pair of capacitors $C_{nA}$ and $C_{nB}$ or grouping of pairs having the same perimeter but different areas.

In a further alternative embodiment, assume that $C_{1A}$ is 3λ by 4λ and the dimensions of $C_{1B}$ are 2λ by 5λ. Their perimeters are equal but their areas are different, 12$\lambda^2$ and 10$\lambda^2$, respectively. Thus, if S1 is high, the output will have a value corresponding to that difference of 2λ. In this embodiment, if $C_{3A}$ is 7000λ by 7000λ and $C_{3B}$ is 10,000λ by 4,000λ, their areas are 49,000,000$\lambda^2$ and 40,000,000$\lambda^2$, respectively, so the subtraction of their values yields a capacitance value of 9,000,000$\lambda^2$. While in one embodiment, all capacitors in each array have different areas by powers of two, other sizes are used in other embodiments.

Figure 5:
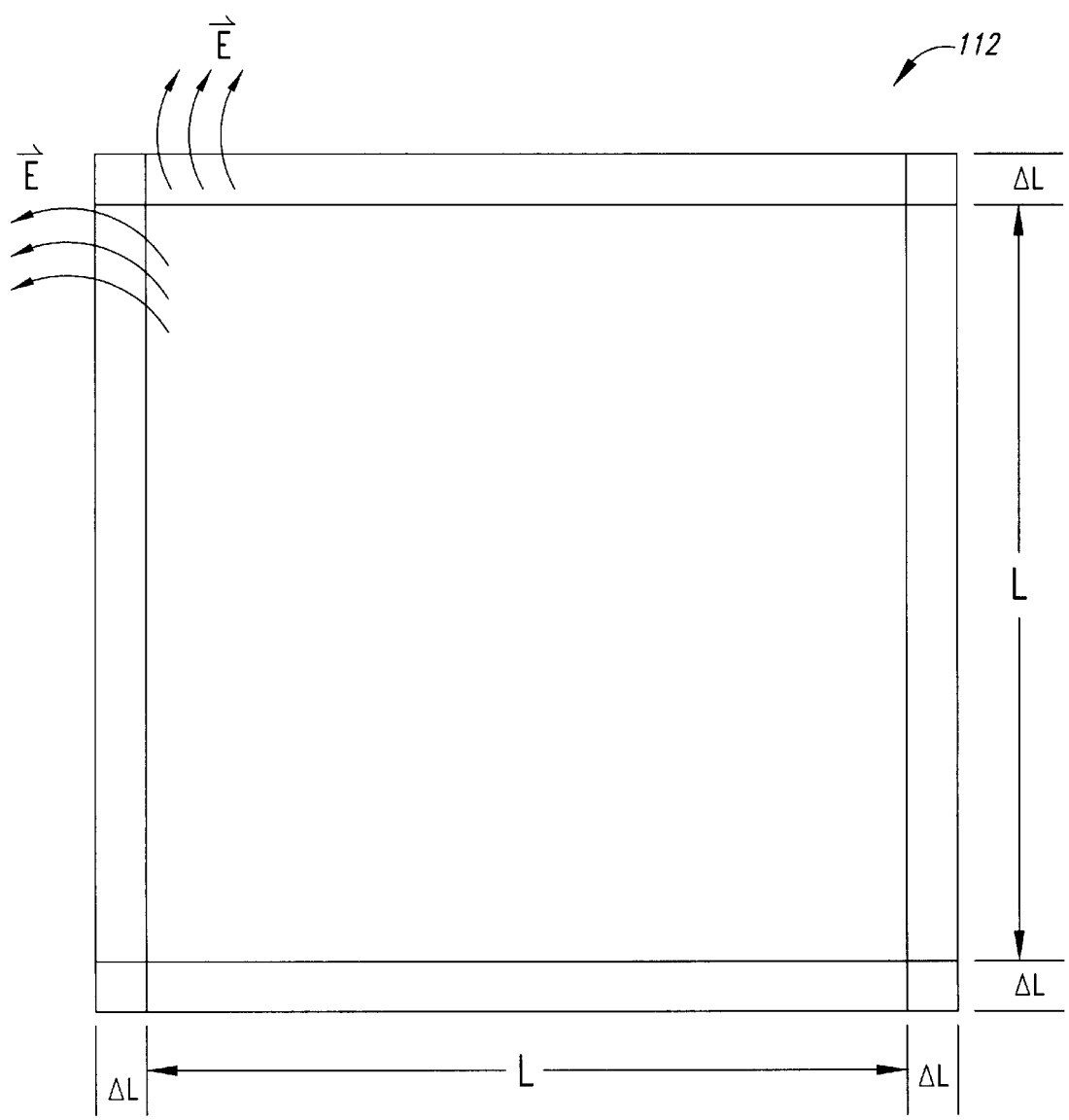
FIG. 5 is a more detailed block diagram of one of the individual capacitive elements of FIG. 4.

FIG. 5 shows an analytical model of a square capacitor under conditions of linewidth variations and variable fringe capacitance. This figure shows how a capacitor of drawn area $L^2$, is affected by linewidth variations ΔL. The capacitance of this capacitor can be represented as $c_1L^2+4c_2L+4c_3$, where $c_1$, $c_2$, and $c_3$ are dependent on voltage, geometry, doping, and other process parameters. The term $L^2c_1$, which is directly proportional to area, models the entire capacitance contribution of a central portion of the capacitor's area. However, each unit length of the edge, in this model, contributes an additional fringe capacitance component, which is modeled here as a capacitance $c_2$ per unit length. Moreover, the electric field enhancement at the 90 degree corners of this square is modeled here as a fixed additional capacitance component $C_3$. For a small linewidth variation of ΔL, the total capacitance then becomes $c_1(L+\Delta L)^2+4(L+\Delta L)c_2+4c_3$, and thus the change in capacitance for a linewidth variation of ΔL is $2c_1L\Delta L+4c_2\Delta L$, plus a typically insignificant term in $\Delta L^2$. By contrast, a differential capacitor of effective area $L^2$, which is produced by differential combination of two capacitors like those of FIG. 1, will have an effective capacitance which is merely $c_1L^2$ without the edge and corner terms $c_2$ and $c_3$, and the change in this capacitance for a linewidth variation of ΔL will be $2c_1L\Delta L$, plus a typically insignificant term in $\Delta L^2$. The variations due to fringing fields and for linewidth variation is better for the differential capacitor than for a conventional single-ended capacitor.

FIG. 6 shows an alternative embodiment of a differential capacitor array structure in which the differential capacitor arrays 100' and 102' are supplemented by an additional capacitor array 101 for capacitor values corresponding to the three least significant bits of the selection signal 104. The additional capacitor array 101, in this example, is used to provide direct selection of the three capacitors corresponding to these least significant bits. Thus a differential capacitor combination, as used in FIG. 2, is used in this example only for capacitor values C4 . . . Cn corresponding to bits n–3 to n of the selection signal 104, while the two least significant bits are used to directly select capacitors C1 through C3. The output of the capacitors C1 through C3 are combined with the output of the differential processing stage 106 and thus in this embodiment only a partially differential capacitor array is utilized for the most significant bits, and the single-ended capacitors $C_1$–$C_3$ provide the capacitance values corresponding to the least significant bits of the selection signal 104.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An integrated circuit capacitor structure, comprising:
   first and second arrays of capacitors, connected to receive identical selection inputs and to selectively connect and disconnect capacitors accordingly;
   wherein individual capacitors of said first array each have a perimeter which is equal to that of a corresponding capacitor in said second array, and an area which differs from that of said corresponding capacitor by a desired differential capacitance value; and means for receiving a first output from said first array and a second output from said second array, and for performing a subtraction operation thereon to simulate an ideal capacitor which has a value equal to one of said differential capacitance values;

whereby the contributions of edge and corner elements of said individual capacitors of said first and second arrays are canceled out by said subtraction operation.

2. The integrated circuit structure of claim 1 wherein each said capacitor is a MOS capacitor.

3. The integrated circuit structure of claim 1 wherein said means is combined with said first array.

4. The integrated circuit structure of claim 1 wherein some ones of said individual capacitors are each implemented as a pair of capacitors in parallel.

5. The integrated circuit structure of claim 1 wherein said selection input is a binary signal which includes at least six bits.

6. An integrated circuit capacitor structure, comprising:

first and second arrays of capacitors, connected to receive an identical signal input, and connected to receive identical selection inputs and to selectively connect and disconnect capacitors from said signal input accordingly;

wherein individual capacitors of said first array each have a perimeter which is equal to that of a corresponding capacitor in said second array, and an area which differs from that of said corresponding capacitor by a respective differential capacitance value;

and wherein corresponding ones of said capacitors of said first and second arrays have areas such that said differential capacitance values are scaled in a fixed dependence on said selection inputs; and a differential processing stage connected to receive signal outputs from said first and second arrays, and to perform a subtraction operation thereon to simulate an ideal capacitor, controlled by said selection input, which has a value equal to said respective differential capacitance value;

whereby the contributions of edge and corner elements of said individual capacitors of said first and second arrays are canceled out by said subtraction operation.

7. The integrated circuit structure of claim 6 wherein each said capacitor is a MOS capacitor.

8. The integrated circuit structure of claim 6 wherein some ones of said individual capacitors are each implemented as a pair of capacitors in parallel.

9. The integrated circuit structure of claim 6 wherein said selection input is a binary signal which includes at least six bits.

10. An integrated circuit capacitor structure, comprising:

first and second arrays of capacitors, both connected to receive a common signal input from a common input switch, and each connected to provide a respective output signal input through a respective output switch, and both connected to receive a common n-bit selection input and to selectively connect and disconnect capacitors from said signal input accordingly;

wherein individual capacitors of said first array each have a perimeter which is equal to that of a respective corresponding capacitor at a corresponding bit position in said second array, and an area which differs from that of said corresponding capacitor by a respective differential capacitance value;

and wherein corresponding ones of said capacitors of said first and second arrays have areas such that said differential capacitance values are scaled in powers of two; and a differential processing stage connected to receive signal outputs from said respective output switches of first and second arrays, and to perform a subtraction operation thereon to simulate an ideal capacitor, controlled by said selection input, which has a value equal to said respective differential capacitance value;

whereby the contributions of edge and corner elements of said individual capacitors of said first and second arrays are canceled out by said subtraction operation.

11. The integrated circuit structure of claim 10 wherein each said capacitor is a MOS capacitor.

12. The integrated circuit structure of claim 10 wherein some ones of said individual capacitors are each implemented as a pair of capacitors in parallel.

13. The integrated circuit structure of claim 10 wherein said selection input is a binary signal which includes at least six bits.

14. An integrated circuit capacitor array structure, comprising:

a first array of capacitors including a number of individual integrated circuit capacitors, each individual integrated circuit capacitor having regions formed to have a substantially predetermined area and perimeter;

a second array of capacitors including a number of individual integrated circuit capacitors, each individual integrated circuit capacitor having regions formed to have a substantially predetermined area and perimeter, and each capacitor of the second array being associated with a capacitor in the first array by having the same perimeter and an area differing by a predetermined amount from its associated capacitor in the first array; and a control circuit coupled to the first and second arrays of capacitors operable to select ones of the capacitors in the first array and the respective associated capacitors in the second array and develop on an output terminal a value dependent on the difference between the capacitance values of the selected capacitors.

15. The integrated circuit capacitor array structure of claim 14 wherein each of capacitors in the first array has rectangular shaped regions having the predetermined area and perimeter.

16. The integrated circuit capacitor array structure of claim 14 wherein each of capacitors in the second array has a rectangular shaped regions having the predetermined area and perimeter.

17. The integrated circuit capacitor array structure of claim 14 wherein each of the capacitors in the first and second arrays is formed by electrically interconnecting a plurality of individual capacitive elements, each individual capacitive element including a square region formed with sides having a minimum length.

18. A method of fabricating an integrated circuit capacitor array structure, the method comprising the steps of:

forming a plurality of integrated circuit capacitors, each integrated circuit capacitor having regions of a predetermined area and perimeter, the capacitors being formed so that there are pairs of capacitors having equal perimeters and areas that differ by a predetermined amount;

selecting at least a pair of integrated circuit capacitors; and using the difference between the capacitance values of the selected pair of capacitors to operate on an input signal and provide an output signal having a value dependent on this difference.

19. The method of claim 18 wherein each of the regions has a rectangular shape.

* * * * *